(12) United States Patent
Breitling et al.

(10) Patent No.: US 10,752,498 B2
(45) Date of Patent: Aug. 25, 2020

(54) MEMS COMPONENT HAVING TWO DIFFERENT INTERNAL PRESSURES

(71) Applicant: Robert Bosch GmbH, Stuttgart (DE)

(72) Inventors: Achim Breitling, Reutlingen (DE); Eckhard Graf, Gomaringen (DE); Jens Frey, Filderstadt (DE); Jochen Reinmuth, Reutlingen (DE); Mawuli Ametowobla, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 202 days.

(21) Appl. No.: 15/780,282

(22) PCT Filed: Oct. 12, 2016

(86) PCT No.: PCT/EP2016/074458
§ 371 (c)(1),
(2) Date: May 31, 2018

(87) PCT Pub. No.: WO2017/097464
PCT Pub. Date: Jun. 15, 2017

(65) Prior Publication Data
US 2018/0346324 A1  Dec. 6, 2018

(30) Foreign Application Priority Data

Dec. 8, 2015  (DE) ........................ 10 2015 224 519

(51) Int. Cl.
*B81C 1/00* (2006.01)
*B81B 7/00* (2006.01)
*G01P 1/02* (2006.01)

(52) U.S. Cl.
CPC ........ *B81C 1/00285* (2013.01); *B81B 7/0038* (2013.01); *G01P 1/023* (2013.01);
(Continued)

(58) Field of Classification Search
CPC ........ B81C 1/00285; B81C 2203/0145; B81B 7/0038; B81B 2203/0315; B81B 2201/0242; B81B 2201/0235; G01P 1/02
See application file for complete search history.

(56) References Cited

U.S. PATENT DOCUMENTS 9,556,019 B2 * 1/2017 Dueweke .............. B81B 7/0038
10,501,311 B2 * 12/2019 Rambach .............. B81B 7/0041
(Continued)

FOREIGN PATENT DOCUMENTS

EP       2004542 B1    6/2014
WO    2015/120939 A1  8/2015

OTHER PUBLICATIONS

International Search Report dated Nov. 17, 2016 of the corresponding International Application PCT/EP2016/074458 filed Oct. 12, 2016.

*Primary Examiner* — Francis C Gray
(74) *Attorney, Agent, or Firm* — Norton Rose Fulbright US LLP; Gerard Messina

(57) ABSTRACT

A method for manufacturing a micromechanical component including a substrate and a cap which is joined to the substrate, and, together with the substrate, encloses a first cavity, a first pressure prevailing and a first gas mixture having a first chemical composition being enclosed in the first cavity. In a first step, an access opening connecting the first cavity to surroundings of the micromechanical component being formed in the substrate or in the cap. In a second step, the first pressure and/or the first chemical composition in the first cavity being set. In a third step, the access opening being sealed by introducing energy or heat into an absorbing portion of the substrate or the cap with the aid of a laser, a reversible getter for further setting the first pressure and/or (Continued)

the first chemical composition being introduced into the first cavity chronologically prior to the third step.

12 Claims, 3 Drawing Sheets

(52) U.S. Cl.
CPC ...... *G01P 1/026* (2013.01); *B81B 2201/0235* (2013.01); *B81B 2201/0242* (2013.01); *B81B 2203/0315* (2013.01); *B81C 2203/0145* (2013.01)

(56) References Cited

U.S. PATENT DOCUMENTS

| | | |
|---|---|---|
| 2005/0189621 A1 | 9/2005 | Cheung |
| 2007/0089524 A1* | 4/2007 | Walchli ................ G01L 9/0079 73/718 |
| 2009/0174148 A1 | 7/2009 | Bischof et al. |
| 2011/0114840 A1 | 5/2011 | Yamazaki et al. |
| 2014/0022718 A1 | 1/2014 | Yamazaki et al. |
| 2014/0124899 A1* | 5/2014 | Gooch ................ H01L 23/053 257/620 |
| 2015/0123217 A1* | 5/2015 | Reinmuth .......... G01P 15/0802 257/415 |
| 2015/0351246 A1 | 12/2015 | Baillin |
| 2017/0158499 A1* | 6/2017 | Ametowobla ...... B81C 1/00325 |

* cited by examiner

MEMS COMPONENT HAVING TWO DIFFERENT INTERNAL PRESSURES

BACKGROUND INFORMATION

In accordance with a method described in PCT Application No. WO 2015/120939 A1, when a certain internal pressure is desired in a cavity of a micromechanical component or a gas mixture having a certain chemical composition is to be enclosed in the cavity, the internal pressure or the chemical composition is frequently set during capping of the micromechanical component or during the bonding process between a substrate wafer and a cap wafer. During capping, for example, a cap is joined to a substrate, whereby the cap and the substrate together enclose the cavity. By setting the atmosphere or the pressure and/or the chemical composition of the gas mixture present in the surroundings during capping, it is thus possible to set the certain internal pressure and/or the certain chemical composition in the cavity.

With the aid of the method described in PCT Application No. WO 2015/120939 A1, an internal pressure may be deliberately set in a cavity of a micromechanical component. It is in particular possible with the aid of this method to manufacture a micromechanical component having a first cavity, a first pressure and a first chemical composition being settable in the first cavity, which differ from a second pressure and a second chemical composition at the time of capping.

In the method for deliberately setting an internal pressure in a cavity of a micromechanical component described in PCT Application No. WO 2015/120939 A1, a narrow access channel to the cavity is created in the cap or in the cap wafer, or in the substrate or in the sensor wafer. Subsequently, the cavity is flooded with the desired gas and the desired internal pressure via the access channel. Finally, the area around the access channel is locally heated with the aid of a laser, the substrate material liquefies locally and, upon solidifying, hermetically seals the access channel.

In rotation rate sensors, for example, a very low pressure is enclosed, which is less than 1 mbar, for example. This is the case since, in rotation rate sensors, a portion of the movable structures is resonantly driven. At low pressure, it is very easy to initiate an oscillation with relatively low stresses due to the low damping.

In acceleration sensors, in contrast, it is not desirable that the sensor starts to oscillate, which would be possible if an external acceleration were present. These sensors are therefore operated at a higher internal pressure. The internal pressure of an acceleration sensor is 500 mbar, for example.

A further method for deliberately setting an internal pressure in a cavity of a micromechanical component is described in European Patent No. EP 2 004 542 B1.

SUMMARY

It is an object of the present invention to provide a method for manufacturing a micromechanical component which is mechanically robust compared to the related art and has a long service life in a simple and cost-effective manner compared to the related art. It is a further object of the present invention to provide a micromechanical component which is compact compared to the related art, mechanically robust and has a long service life. According to the present invention, this applies in particular to a micromechanical component having a (first) cavity. With the aid of the example method according to the present invention and the example micromechanical component according to the present invention, it is furthermore also possible to implement a micromechanical component in which a first pressure and a first chemical composition may be set in the first cavity, and a second pressure and a second chemical composition may be set in a second cavity. For example, such a method is provided for manufacturing micromechanical components for which it is advantageous when a first pressure is enclosed in a first cavity and a second pressure is enclosed in a second cavity, it being specified that the first pressure is different from the second pressure. This is the case, for example, when a first sensor unit for rotation rate measurement and a second sensor unit for acceleration measurement are to be integrated into a micromechanical component. In particular, it is the object of the present invention to enable a stable cavity internal pressure over the service life of the micromechanical component.

The object may be achieved in that a reversible getter for further setting the first pressure and/or the first chemical composition is introduced into the first cavity chronologically prior to the third method step.

In this way, a method for manufacturing a micromechanical component is provided in a simple and cost-effective manner, with the aid of which the first pressure in the first cavity, in particular when the first cavity is a rotation rate sensor cavity, may be kept essentially constant or stabilized over the service life, or with the aid of which the first pressure may be further reduced after the first pressure has been temporarily set. This is achieved, for example, in that small gas amounts which outgas from the materials within the first cavity over the service life, or which reach the first cavity as a result of gas diffusion, for example through the substrate or through the cap or through a bond frame or bond web between the first cavity and the second cavity, are bound by the reversible getter.

In particular, the method according to the present invention is advantageous since, due to the use of a reversible getter, the reversible getter does not have to be present in a chemically inert state prior to capping or prior to the bonding process. In other words, the reversible getter does not have to be in an inactivated state prior to the bonding process, but may already be in an activated state prior to the bonding process. In this way, according to the method according to the present invention, the getter does not have to be activated in a separate temperature step after the encapsulation or after the bonding process. Rather, it is possible that the reversible getter is active immediately after the reversible getter has been deposited. In this way, for example, it is made possible to use materials as getter materials which are not used in methods of the related art.

The example method according to the present invention is also advantageous since the reversible getter or the introduced material or the getter material or the activated getter only has to have a low adsorption capability or sorption capability, since it is only required to absorb small gas amounts which penetrate after the cavity has been hermetically sealed. This is in particular the case due to the execution of the first, second and third method steps, since in this way the first pressure may be preset, and the getter only has to further set the first pressure. This, in particular, enables the use of getters or of getter materials having a low gas absorption capability compared to the related art. It is provided according to the present invention, for example, that the maximum number of particles to be absorbed by the getter per getter surface area is $10^{21}$ or $10^{20}$ or $10^{19}$ or $10^{18}$ or $10^{17}$ or $10^{16}$ or $10^{15}$ or $10^{14}$ or $10^{13}$ or $10^{12}$ or $10^{11}$ or $10^{10}$ or $10^9$ or $10^8$ or $10^7$ or $10^6$ $1/m^2$.

The example method according to the present invention is in particular advantageous compared to a method in which different pressures p1/p2 are required in a cavity of a rotation rate sensor p1 and in a cavity of an acceleration sensor p2, in the cavity of the rotation rate sensor a high pressure, which initially is enclosed in both cavities, subsequently being brought with the aid of a getter to a low pressure by activation of the getter via a temperature step in the cavity of the rotation rate sensor. Compared to such a method, the example method according to the present invention is comparatively simple and cost-effective.

Furthermore, the example method according to the present invention is advantageous when the sealing of an MEMS structure situated in the first cavity with the aid of a cap wafer takes place at high temperatures, for example using seal glass as a joining material or using various other bonding materials or bonding systems, such as eutectic aluminum-germanium (AlGe) or copper-tin-copper (CuSnCu) systems. Even if the bonding method is carried out under a vacuum and at high temperatures, gases from the bonding system evaporate at high temperature and cause a residual pressure in the cavity, which prevails during the bonding method in the cavity independently of the very low pressure. This residual pressure may be considerably reduced compared to the related art by the method according to the present invention.

The example method according to the present invention is also advantageous when surfaces of sensors or sensor cores are provided with organic coatings which prevent movable structures from sticking together, and these organic coatings degrade at the high temperatures, for example during the bonding method, and are no longer fully effective. An at least partial release of the organic layers into the cavity, and a thus increased internal pressure after sealing of the MEMS element, may be counteracted with the aid of the method according to the present invention in a simple and cost-effective manner.

In particular, the example method according to the present invention is also advantageous when outgassing of noble gases or other gases out of the wafers or out of the substrate or out of the cap or out of a bonded layer takes place during the bonding process, when no pumping, or only poor pumping, of the noble gases or other gases by the getter is possible, since it is possible with the aid of the method according to the present invention to set the first pressure chronologically after the bonding process with the aid of the access opening. In this way, the method according to the present invention may effectively counteract such outgassing. This is advantageous since outgassing of noble gases which cannot be pumped, or can only be poorly pumped, by the getter would limit the minimally achievable pressure, and this outgassing could cause a high, undesirable variation of the internal pressure even at higher pressures.

In connection with the present invention, the term "getter" shall be understood to mean a chemically reactive material, which is used to maintain a vacuum for as long as possible. For example, gas molecules on the surface of the getter form a direct chemical bond with the atoms of the getter material. As an alternative or in addition, however, it is also provided that the gas molecules are retained on the getter material by sorption. In this way, the gas molecules are "trapped" in or on the surface of the getter material. In connection with the present invention, a distinction is to be made between an activated getter and an inactivated getter, the activated getter having a higher trapping rate compared to the inactivated getter. A trapping rate, for example, shall be understood to mean a number of gas molecules trapped in or on the surface of the getter material per unit of time, for example per second. Furthermore, according to the present invention a distinction is to be made between a reversible getter and an irreversible getter. According to the present invention, a reversible getter encompasses at least partially or predominantly reversible getter material, and an irreversible getter encompasses at least partially or predominantly irreversible getter material. However, it is also provided according to the present invention that both a reversible getter and an irreversible getter each encompass at least partially reversible getter material and at least partially irreversible getter material. According to the present invention, a reversible getter material shall be understood to mean a getter material which, at a first point in time or during a first time duration, essentially traps or takes up gas molecules in or on the surface of the getter material and, at a second point in time or during a second time duration, essentially releases or gives off trapped gas molecules again out of or from the surface of the getter material. According to the present invention, "essentially trap or take up" shall be understood in such a way, for example, that the trapping rate is greater than the release rate, or that a first sum of the adsorption rate and absorption rate is greater than a desorption rate. According to the present invention, "essentially release or give off" shall be understood in such a way, for example, that the trapping rate is less than the release rate, or that the first sum is less than the desorption rate. An adsorption rate, for example, shall be understood to mean a number of gas molecules trapped on the surface of the getter material per unit of time, for example per second. An absorption rate, for example, shall be understood to mean a number of gas molecules trapped in the surface of the getter material or in the volume of the getter material per unit of time, for example per second. A release rate or desorption rate, for example, shall be understood to mean a number of gas molecules released or given off out of or from the surface of the getter material per unit of time, for example per second. According to the present invention, a reversible getter is essentially regenerable, or transferrable into an initial state having high absorption readiness and/or adsorption readiness. According to the present invention, absorption readiness or adsorption readiness shall be understood to mean the provision of a high absorption rate or adsorption rate when corresponding gas molecules are present.

According to the present invention, a particle shall preferably be understood to mean an atom or an accumulation of atoms, such as a molecule or multiple molecules. In connection with the present invention, the particle is in a gaseous, liquid or solid state, or forms part of a gaseous, liquid or solid phase, and includes at least one phase interface with its surroundings. In particular, according to the present invention a particle shall be understood to mean a small body in relation to the scale of the micromechanical component, i.e., a body having an extension of no more than $1/10$ of a maximum extension of the micromechanical component.

In connection with the present invention, the term "micromechanical component" shall be understood in such a way that the term encompasses both micromechanical components and microelectromechanical components.

The present invention is preferably provided for the manufacture of a or for a micromechanical component having a cavity. However, the present invention is also provided, for example, for a micromechanical component having two cavities, or having more than two, i.e., three, four, five, six or more than six, cavities.

The access opening is preferably sealed by introducing energy or heat with the aid of a laser into a portion of the substrate or of the cap which absorbs this energy or this heat. Energy or heat is preferably introduced consecutively into the respective absorbing portion of the substrate or of the cap of multiple micromechanical components, which are manufactured together on a wafer, for example. However, alternatively, it is also provided to introduce the energy or heat simultaneously into the respective absorbing portion of the substrate or of the cap of several micromechanical components, for example using multiple laser beams or laser devices.

Advantageous embodiments and refinements of the present invention may be derived from the description herein with reference to the figures.

According to one preferred refinement, it is provided that the cap, together with the substrate, encloses a second cavity, a second pressure prevailing and a second gas mixture having a second chemical composition being enclosed in the second cavity.

According to one preferred refinement, it is provided that the substrate is joined to the cap in a fourth method step in such a way that the first cavity is hermetically separated from the surroundings, the fourth method step being carried out chronologically before or chronologically after the first method step. In this way, it is advantageously made possible that the access opening may be formed either before or after the substrate is joined to the cap.

According to one preferred refinement, it is provided that the reversible getter is regenerated and/or activated in a fifth method step. For example, it is provided that the release rate is at least partially greater than the trapping rate during the regeneration. For example, it is provided as an alternative or in addition that the reversible getter, or the getter material of the reversible getter, has a higher trapping rate chronologically after the activation compared to the point in time chronologically prior to the activation. In this way, it is advantageously made possible that a getter is provided which is reversible and/or activatable.

According to one preferred refinement, it is provided that the fifth method step is carried out at a temperature between 20° C. and 400° C., preferably at a temperature between 50° C. and 300° C., in particular preferably at a temperature between 100° C. and 200° C. In this way, it is advantageously made possible that a getter which is regenerable by a temperature step may be used.

According to one preferred refinement, it is provided that the third method step and the fifth method step are at least partially carried out at the same time. In this way, it is advantageously made possible that the reversible getter may be regenerated and/or activated chronologically during the sealing of the access opening.

According to one preferred refinement, it is provided that the fifth method step is carried out chronologically after the first method step and chronologically prior to the third method step. In this way, it is advantageously made possible that the reversible getter may be regenerated and/or activated chronologically while the access opening is open.

According to one preferred refinement, it is provided that a pumping step and/or a heating step and/or a rinsing step and/or a cleaning step is/are carried out in a sixth method step. In this way, advantageously a removal of gases and/or particles from the first cavity and into the surroundings of the micromechanical component and/or a deliberate surface conditioning of the surfaces of the substrate and/or of the cap facing the first cavity are made possible.

According to one preferred refinement, it is provided that the sixth method step is carried out chronologically after the first method step and chronologically prior to the third method step. In this way, it is advantageously made possible that not only gases and/or particles which reached the first cavity due to the bonding process, but also gases and/or particles which reached the first cavity due to the formation of the access opening, may be removed from the first cavity and transferred into the surroundings of the micromechanical component.

Another object of the present invention is a micromechanical component including a substrate and including a cap, which is joined to the substrate and, together with the substrate, encloses a first cavity, a first pressure prevailing and a first gas mixture having a first chemical composition being enclosed in the first cavity, the substrate or the cap including a closed access opening, a reversible getter being situated in the first cavity. In this way, a compact, mechanically robust and cost-effective micromechanical component having a set first pressure is advantageously provided. The above-mentioned advantages of the method according to the present invention also apply correspondingly to the micromechanical component according to the present invention.

According to one preferred refinement, it is provided that the reversible getter includes an irreversible getter material and/or a reversible getter material. In this way, it is advantageously made possible that the reversible getter does not release absorbed particles into the cavity again and/or at least partially deliberately releases absorbed particles into the cavity again.

According to one preferred refinement, it is provided that the activated getter is situated in such a way that a first projection of the activated getter onto a main extension plane of the micromechanical component and a second projection of the access opening onto the main extension plane partially overlap. In this way, it is advantageously made possible that the getter may be at least partially activated by a laser radiation which is incident essentially perpendicular to the main extension plane and through the access opening.

According to one preferred refinement, it is provided that the substrate and/or the cap includes silicon. In this way, it is advantageously made possible that the micromechanical component may be manufactured using conventional manufacturing methods of film technology.

According to one preferred refinement, it is provided that the cap, together with the substrate, encloses a second cavity, a second pressure prevailing and a second gas mixture having a second chemical composition being enclosed in the second cavity. In this way, a compact, mechanically robust and cost-effective micromechanical component having a set first pressure and second pressure is advantageously provided.

According to one preferred refinement, it is provided that the first pressure is lower than the second pressure, a first sensor unit for rotation rate measurement being situated in the first cavity, and a second sensor unit for acceleration measurement being situated in the second cavity. In this way, a mechanically robust micromechanical component for rotation rate measurement and acceleration measurement, having optimal operating conditions for both the first sensor unit and the second sensor unit, is advantageously provided.

DETAILED DESCRIPTION OF EXAMPLE EMBODIMENTS

Figure 1:
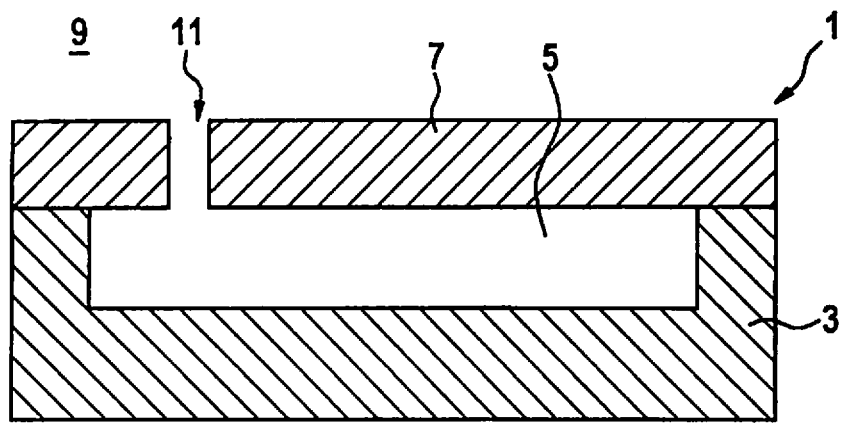
FIG. 1 shows a micromechanical component having an open access opening according to one exemplary specific embodiment of the present invention in a schematic representation.

Identical parts are always denoted by the same reference numerals in the various figures and are therefore generally also cited or mentioned only once.

Figure 2:
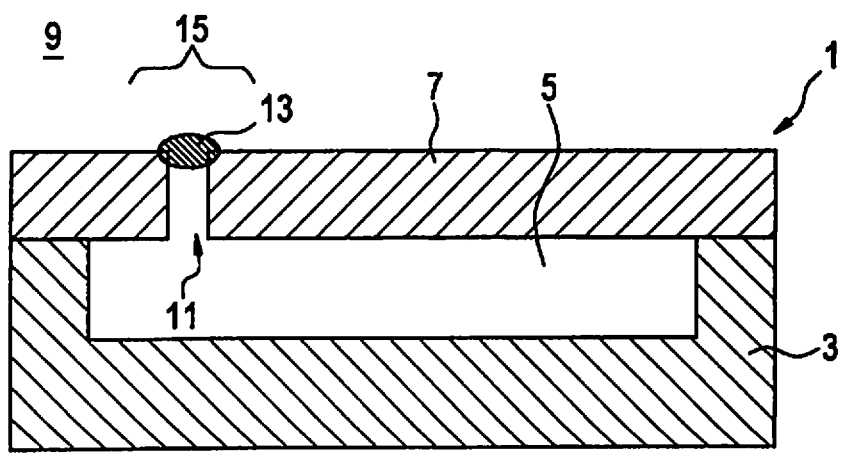
FIG. 2 shows the micromechanical component according to FIG. 1 having a sealed access opening in a schematic representation.

FIG. 1 and FIG. 2 show schematic representations of a micromechanical component 1 having an open access opening 11 in FIG. 1, and having a sealed access opening 11 in FIG. 2, according to one exemplary specific embodiment of the present invention. Micromechanical component 1 includes a substrate 3 and a cap 7. Substrate 3 and cap 7 are, preferably hermetically, joined to one another and together enclose a first cavity 5. For example, micromechanical component 1 is designed in such a way that substrate 3 and cap 7 additionally together enclose a second cavity. The second cavity, however, is not shown in FIG. 1 and in FIG. 2.

For example, a first pressure prevails in first cavity 5, in particular when access opening 11 is sealed, as is shown in FIG. 2. Moreover, a first gas mixture having a first chemical composition is enclosed in first cavity 5. In addition, for example, a second pressure prevails in the second cavity, and a second gas mixture having a second chemical composition is enclosed in the second cavity. Access opening 11 is preferably situated in substrate 3 or in cap 7. In the present exemplary embodiment, access opening 11 is situated in cap 7 by way of example. According to the present invention, however, it may alternatively thereto also be provided that access opening 11 is situated in substrate 3.

It is provided, for example, that the first pressure in first cavity 5 is lower than the second pressure in the second cavity. It is also provided, for example, that a first micromechanical sensor unit for rotation rate measurement, which is not shown in FIG. 1 and FIG. 2, is situated in first cavity 5, and a second micromechanical sensor unit for acceleration measurement, which is not shown in FIG. 1 and FIG. 2, is situated in the second cavity.

Figure 3:
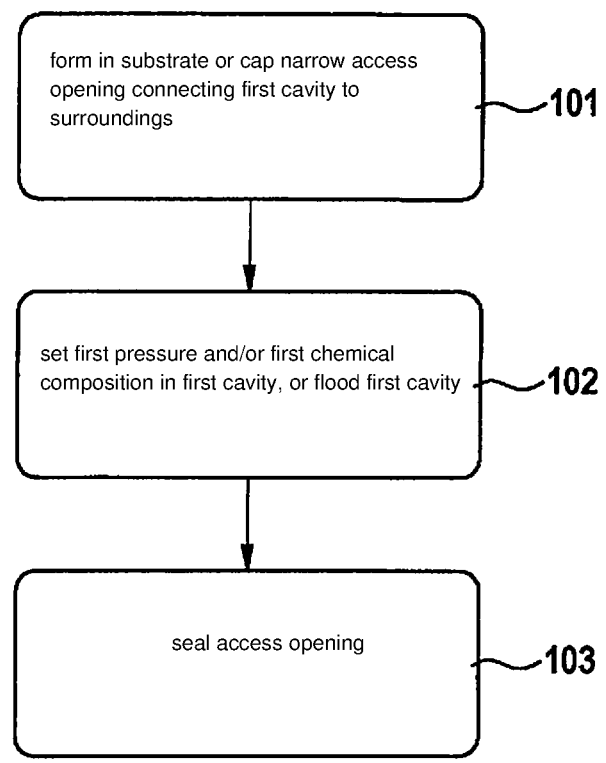
FIG. 3 shows a method for manufacturing a micromechanical component according to one exemplary specific embodiment of the present invention in a schematic representation.

FIG. 3 shows a method for manufacturing micromechanical component 1 according to one exemplary specific embodiment of the present invention in a schematic representation. In this method, in a first method step 101, in particular narrow access opening 11 connecting first cavity 5 to surroundings 9 of micromechanical component 1 is formed in substrate 3 or in cap 7. FIG. 1 shows micromechanical component 1 after first method step 101 by way of example. Moreover, in a second method step 102, the first pressure and/or the first chemical composition in first cavity 5 is set, or first cavity 5 is flooded with the desired gas and the desired internal pressure via the access channel. Furthermore, for example, in a third method step 103, access opening 11 is sealed by introducing energy or heat into an absorbing portion of substrate 3 or cap 7 with the aid of a laser. Alternatively, for example, it is also provided that in the third method step 103, the area around the access channel is preferably heated only locally by a laser, and the access channel is hermetically sealed. It is thus advantageously possible to provide the method according to the present invention also with energy sources other than a laser for sealing access opening 11. FIG. 2 shows micromechanical component 1 after third method step 103 by way of example.

Furthermore, it is also provided as an alternative, for example, that access opening 11 is sealed or closed by a thin film closure in third method step 103.

Chronologically after third method step 103, it is possible for mechanical stresses to occur in a lateral area 15, shown by way of example in FIG. 2, on a surface of cap 7 facing away from cavity 5 and in the depth perpendicular to a projection of lateral area 15 onto the surface, i.e., along access opening 11 and in the direction of first cavity 5 of micromechanical component 1. These mechanical stresses, in particular local mechanical stresses, are present in particular on and in the vicinity of an interface between a material area 13 of cap 7, which in third method step 103 transitions into a liquid state and after third method step 103 transitions into a solid state and seals access opening 11, and a residual area of cap 7, which remains in a solid state during third method step 103. In FIG. 2, material area 13 of cap 7 sealing access opening 11 is to be regarded only schematically or is shown only schematically, in particular with respect to its lateral extension or shape, extending in particular in parallel to the surface, and in particular with respect to its expansion or configuration perpendicular to the lateral extension, extending in particular perpendicular to the surface.

Figure 4:
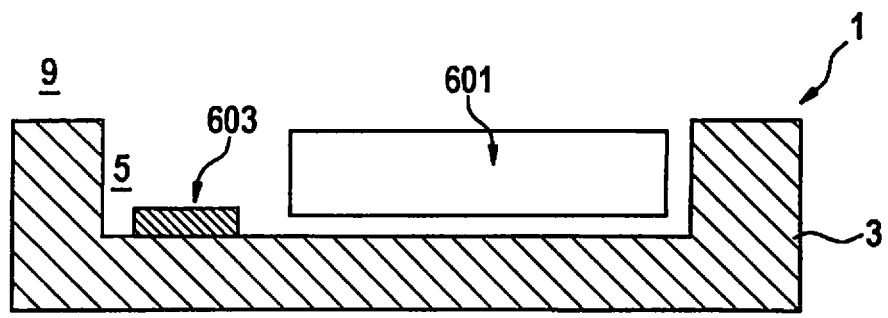
FIG. 4, FIG. 5 and FIG. 6 show a micromechanical component at different points in time of the method according to the present invention according to one further exemplary specific embodiment of the present invention in schematic illustrations.
Figure 5:
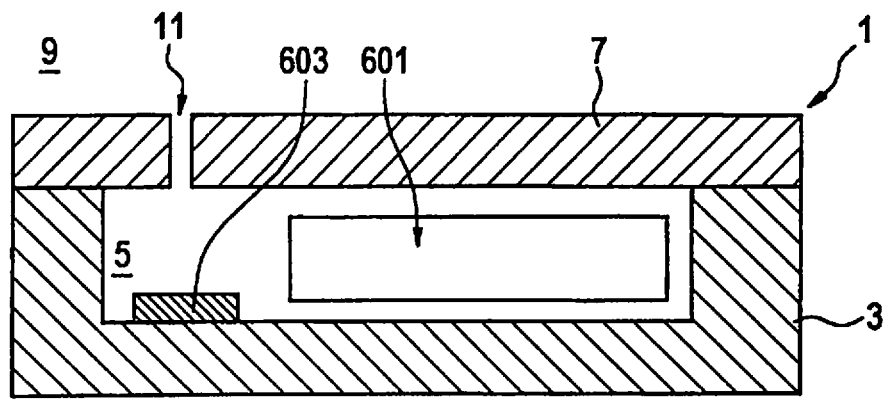
Figure 6:
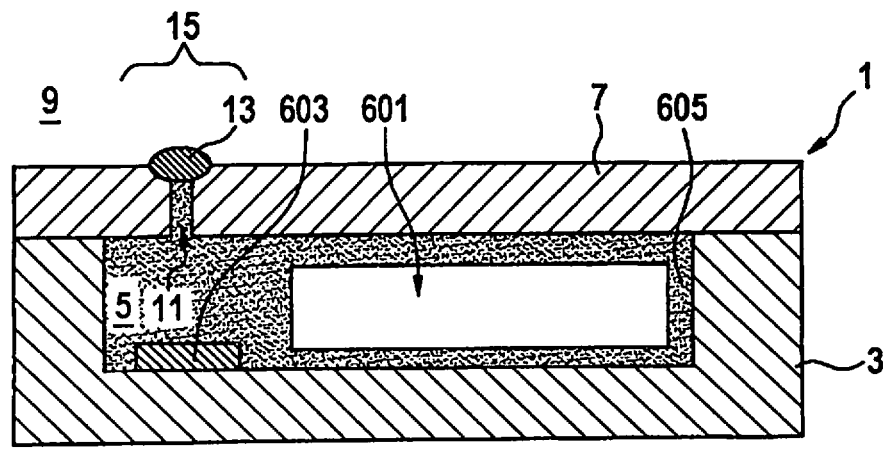

FIG. 4, FIG. 5 and FIG. 6 show a micromechanical component at different points in time of the method according to the present invention according to one further exemplary specific embodiment of the present invention in schematic illustrations. For example, a reversible getter 603 is introduced into first cavity 5 chronologically prior to third method step 103. For example, it is also provided that multiple reversible getters 603 are introduced into first cavity 5. Furthermore, it is also provided, for example, that, in each case, one or multiple reversible getters 603 is or are introduced into first cavities 5 of multiple micromechanical components 1. Reversible getter 603 includes a regenerable adsorption material 603, for example. In other words, initially a material, for example zeolites, are introduced, for example, into first cavity 5 of a MEMS element 601, the material on the one hand having an adsorption capability for reactive gases, such as oxygen, hydrogen, etc., but on the other hand being able to reversibly release these again, for example at an elevated temperature. For example, the releasing is also referred to as "baking out" or "regenerating." The adsorption material or the reversible getter 603 present in the chamber or in first cavity 5 now, for example, takes up residual gas penetrating possibly due to leaks, or still present in the chamber or first cavity 5, over the service life of the component or micromechanical component 1.

For example, substrate 3 is joined to cap 7 in a fourth method step in such a way that cavity 5 is hermetically separated from surroundings 9. In other words, MEMS element 601 is provided with cap 7, for example after the material or the getter material or reversible getter 603 has been introduced. The fourth method step is carried out chronologically before or chronologically after first method step 101, for example.

It is also provided, for example, that reversible getter 603 is regenerated and/or activated in a fifth method step. In other words, adsorption material 603 is regenerated or activated in the fifth method step, for example under a defined atmosphere and at an elevated temperature 605. Moreover, it is provided, for example, that the fifth method step is carried out at a temperature between 20° C. and 400° C., preferably at a temperature between 50° C. and 300° C., in particular preferably at a temperature between 100° C. and 200° C. In other words, the fifth method step preferably takes place at an elevated temperature, which, on the one hand, allows residual gases possibly still present in first cavity 5 to be evaporated and, on the other hand, is used to regenerate the adsorptive material or regenerable getter 603 present in first cavity 5.

For example, reversible getter 603 is in an inactive state or an inactivated getter 603 in FIG. 4 and FIG. 5, and is in an activated state or an activated getter 603 in FIG. 6.

For example, it is also provided that third method step 103 and the fifth method step are at least partially carried out at the same time. In other words, it is provided, for example, that third method step 103 and the fifth method step take place or are carried out in one step, so that the sealing, or the sealing of access opening 11, takes place under a defined atmosphere and, for example, at an elevated temperature.

For example, it is also provided that a pumping step and/or a heating step and/or a rinsing step and/or a cleaning step is/are carried out in a sixth method step. Moreover, it is provided, for example, that the sixth method step is carried out chronologically after the first method step and chronologically prior to third method step 103.

In other words, after access hole 11 is or multiple access holes 11 are created, first cavity 5 is initially pumped out in order to remove noble gases, for example, from first cavity 5. For example, access holes 11 are closed under a defined atmosphere chronologically thereafter, and the getter or reversible getter 603 is, in turn, activated chronologically thereafter. For example, it is also provided that heating, pumping and rinsing or cleaning cycles are applied chronologically after the generation of access holes 11. In this way, an outgassing of undesirable gases or a deliberate surface conditioning may be deliberately set, for example.

With the method according to the present invention, the introduced material or reversible getter 603 does not initially have to be present in a chemically inert state in order to be activated in a separate temperature step after the encapsulation or after the bonding process. Rather, the material or reversible getter 603 may be active immediately after the deposition or after the deposition of reversible getter 603. Moreover, the introduced material or reversible getter 603 only has to have a low adsorption capability or absorption capability, since the introduced material or reversible getter 603 preferably has to absorb only small gas amounts which penetrate, for example, after the cavity or first cavity has been hermetically sealed.

Furthermore, the method according to the present invention allows the internal pressure and the gas composition of the cavity or of the first cavity to be deliberately influenced chronologically after the first method step, the second method step and the third method step have been carried out. For example, the getter counteracts a change in the gas composition caused by influencing factors occurring chronologically after the wafer process, such as the temperature during the use of the sensor element.

The considerably reduced requirements as a result of the method according to the present invention, compared to the related art, significantly increase the selection of possible materials or getter materials or reversible getters 603, and at the same time enable cost savings due to more cost-effective deposition methods.

Further advantages of the method according to the present invention and of micromechanical component 1 according to the present invention compared to the related art are as follows:

- It is easily possible to combine different sensor cores having different requirements with regard to the internal pressure on one chip.
- It is possible to set arbitrary internal pressures, even very low internal pressures, in a MEMS cavity.
- After the cavity has been sealed, residual gas amounts possibly penetrating due to leaks, or remaining in the cavity, may be reliably trapped over the service life.
- The technology is simple, robust and cost-effective.
- The manufacturing method is compatible with the known manufacturing processes, for example also with capping processes, such as with aluminum-germanium (AlGe) eutectic bonding and with seal glass bonding.
- The method according to the present invention allows particularly stable sealing of the MEMS cavity over the service life.
- In combination sensors, such as in a micromechanical component 1 including a first sensor unit for rotation rate measurement and a second sensor unit for acceleration measurement, it is possible to use getter materials which have a low sorption capability since it is possible to keep a very low pressure already available in first cavity 5 of the rotation rate sensor via the access hole or access opening 11 before sealing.
- It is possible to use very small amounts of getter materials in combination sensors since it is possible to keep a very low pressure already available in the cavity of the rotation rate sensor via the access hole before sealing.
- It is possible to use getter materials in combination sensors which are activated independently of the bonding process, for example by laser radiation. As an alternative to an activation by laser radiation, it is in particular provided according to the present invention that the getter material is activated at temperatures below, preferably considerably below, in particular preferably at least 10° C. below a bonding temperature. For example, however, it is also provided that the getter material is activated via a plasma and/or a reactive gas and/or heating with the aid of a laser.
- Irreversible and regenerable getter materials may be used.
- Gases which outgas during the bonding process may first be pumped out via the access hole before the getter is activated.

What is claimed is:

1. A method for manufacturing a micromechanical component including a substrate, and including a cap, which is joined to the substrate, and, together with the substrate, encloses a first cavity, a first pressure prevailing and a first gas mixture having a first chemical composition being enclosed in the first cavity, the method comprising:
    in a first method step, forming, in one of the substrate or the cap, an access opening connecting the first cavity to surroundings of the micromechanical component;
    in a second method step, setting, in the first cavity, at least one of the first pressure and the first chemical composition;

in a third method step, sealing the access opening by introducing energy or heat into an absorbing portion of the substrate or the cap with the aid of a laser;

wherein a reversible getter for further setting the at least one of the first pressure and the first chemical composition is introduced into the first cavity chronologically prior to the third method step, wherein the reversible getter includes a regenerable adsorption material.

2. The method as recited in claim 1, wherein the substrate is joined to the cap in a fourth method step in such a way that the cavity is hermetically separated from the surroundings, the fourth method step being carried out chronologically before or chronologically after the first method step.

3. The method as recited in claim 2, wherein, in a fifth method step, the reversible getter is at least one of regenerated and activated.

4. The method as recited in claim 1, wherein the fifth method step is carried out at a temperature between 20° C. and 400° C.

5. The method as recited in claim 4, wherein the fifth method step is carried out at a temperature between 50° C. and 300° C.

6. The method as recited in claim 5, wherein the fifth method step is carried out at a temperature between 100° C. and 200° C.

7. The method as recited in claim 3, wherein the third method step and the fifth method step are at least partially carried out at the same time.

8. The method as recited in claim 1, wherein, in a sixth method step, at least one of the following is performed: pumping, heating, rinsing step, and cleaning.

9. A micromechanical component, comprising:
a substrate;
a cap which is joined to the substrate, and, together with the substrate, encloses a first cavity, a first pressure prevailing and a first gas mixture having a first chemical composition being enclosed in the first cavity, one of the substrate or the cap including a sealed access opening;
wherein a reversible getter for further setting at least one of the first pressure and the first chemical composition, is situated in the first cavity.

10. The micromechanical component as recited in claim 9, wherein the reversible getter includes at least one of an irreversible getter material and a reversible getter material.

11. The micromechanical component as recited in claim 10, wherein the cap, together with the substrate, encloses a second cavity, a second pressure prevailing and a second gas mixture having a second chemical composition being enclosed in the second cavity.

12. The micromechanical component as recited in claim 11, wherein the first pressure is lower than the second pressure, a first sensor unit for rotation rate measurement being situated in the first cavity, and a second sensor unit for acceleration measurement being situated in the second cavity.

* * * * *